United States Patent
Sardat et al.

(10) Patent No.: US 9,203,320 B2
(45) Date of Patent: Dec. 1, 2015

(54) PRINTED CIRCUIT BOARD FOR A COMPRESSOR HOUSING

(75) Inventors: Pierre Sardat, Le Raincy (FR); Bruno Hadjelis, Saint Ouen L'aumone (FR); Hubert Lescot, Eragny (FR)

(73) Assignee: VALEO JAPAN CO, LTD, Saitama (JP)

( * ) Notice: Subject to any disclaimer, the term of this patent is extended or adjusted under 35 U.S.C. 154(b) by 235 days.

(21) Appl. No.: 13/532,080

(22) Filed: Jun. 25, 2012

(65) Prior Publication Data

US 2013/0021062 A1  Jan. 24, 2013

(30) Foreign Application Priority Data

Jun. 24, 2011  (FR) ..................................... 11 01967

(51) Int. Cl.
*H03K 19/0175* (2006.01)
*H02M 3/02* (2006.01)
*H02M 3/335* (2006.01)
*H02M 7/00* (2006.01)
*H05K 1/02* (2006.01)

(52) U.S. Cl.
CPC .......... *H02M 3/33523* (2013.01); *H02M 7/003* (2013.01); *H05K 1/0262* (2013.01); *H05K 1/0227* (2013.01); *H05K 2201/09972* (2013.01)

(58) Field of Classification Search
CPC ........ H02M 3/02; H03L 5/02; H03K 19/0175
USPC ....... 326/63, 80; 327/333; 315/160; 318/139; 363/21.12, 15

See application file for complete search history.

(56) References Cited

U.S. PATENT DOCUMENTS

| | | | |
|---|---|---|---|
| 5,675,223 A | 10/1997 | Yoshizawa et al. | |
| 5,815,381 A * | 9/1998 | Newlin | 363/17 |
| 5,949,659 A * | 9/1999 | Lesche | 363/16 |
| 2006/0017426 A1* | 1/2006 | Yang et al. | 323/283 |
| 2010/0053999 A1* | 3/2010 | Jang et al. | 363/21.01 |
| 2012/0057379 A1* | 3/2012 | Aiello | 363/49 |

* cited by examiner

*Primary Examiner* — Daniel D Chang
(74) *Attorney, Agent, or Firm* — Osha Liang LLP

(57) ABSTRACT

This printed circuit board (12) comprising:
  a first portion (20) having first electronic components (22) of which the earth electrode is on a first voltage source (14);
  a second portion (24) having second electronic components (26) of which the earth electrode is on a second voltage source (16);
  a switched-mode power supply circuit (34) of which one input is connected to the first portion (20) and of which at least one output is connected to the second portion (24),
is characterized in that it comprises modification means (36) for modifying a switching frequency of the switched-mode power supply circuit (34) depending on data values (32) to be transmitted between the first portion (20) and the second portion (24), the said data being able to take at least two distinct values.

18 Claims, 3 Drawing Sheets

PRINTED CIRCUIT BOARD FOR A COMPRESSOR HOUSING

The present invention relates to a printed circuit board, notably for a compressor housing.

The invention applies more particularly to the field of electrically controlled compressors used notably in the air conditioning systems of motor vehicles.

These compressors are controlled with the aid of a microcontroller incorporated into a printed circuit board placed on a housing of the compressor.

This printed circuit board usually comprises three portions:
- a first portion having first electronic components of which the earth electrode is on a first voltage source;
- a second portion having second electronic components of which the earth electrode is on a second voltage source; and
- a third portion, forming a potential barrier, inserted between the first and the second portions.

On this board, the microcontroller is incorporated into the second portion while being powered by the first voltage source by means of a switched-mode power supply. The instruction to switch this switched-mode power supply is given by the microcontroller.

Typically, this microcontroller receives, from a CAN bus of the vehicle, a data signal comprising the instruction to stop the power supply. The microcontroller also receives a second signal, called the APC or "wake-up" signal, comprising an instruction to power-up/wake-up or to start the power supply. This second signal is wired independently of the first signal.

For reasons of reliability, the microcontroller must monitor this APC signal in order to prevent a conflict between the received stop and start instructions that may cause damage on the printed circuit board.

The second signal is transmitted from the first portion to the second portion through an isolation component situated on the potential barrier. Usually, the isolation component used is an optocoupler.

However, the use of an optocoupler has several drawbacks.

Specifically, the use of an optocoupler in a motor-vehicle application is not easy because of problems of reliability of this component that is not qualified for the motor-vehicle sector. Moreover, the addition of components represents additional volume and weight.

Furthermore, optocouplers are costly and have a limited service life.

The invention proposes to improve the situation.

The object of the present invention is therefore to avoid the use of an isolation component.

The invention relates first of all to a printed circuit board comprising:
- a first portion having first electronic components of which the earth electrode is on a first voltage source;
- a second portion having second electronic components of which the earth electrode is on a second voltage source;
- a switched-mode power supply circuit of which one input is connected to the first portion and of which at least one output is connected to the second portion,
- characterized in that it comprises modification means for modifying a switching frequency of the switched-mode power supply circuit depending on data values to be transmitted between the first portion and the second portion, the said data being able to take at least two distinct values.

For example, the first voltage source delivers a lower voltage than that of the second voltage. In a particular example, the first voltage source is a low voltage and the second voltage source is a high voltage. Notably, in the context of the present application, a low voltage means a voltage below 60V and a high voltage means a voltage above 60V.

Therefore, the present invention makes it possible to transmit the data signal without going through an isolation component by modifying the switching frequency of the power supply circuit.

Advantageously, the board comprises means for measuring the switching frequency at the output of the power supply circuit.

Preferably, the measurement means comprise a matching circuit connected to the output.

Advantageously, the board comprises means for determining the value of the data depending on the measured switching frequency.

Preferably, the means for determining the value of the data comprise a microcontroller.

Advantageously, the switched-mode power supply circuit comprises a transformer of which the primary is connected to the input and the secondary is connected to the output.

According to a preferred feature, the modification means comprise a first resistor and a capacitor. Advantageously, each distinct value of the data corresponds to a distinct range of switching frequencies.

According to a first embodiment, the data signal is a logic signal and the number of distinct switching frequency ranges is equal to 2.

As an example, the data signal is an APC ("After Contact") signal.

Preferably, the modification means comprise, in this case, an MOS transistor and a second resistor both being connected in series parallel to the first resistor, the gate of the MOS transistor being connected to the data signal.

According to a second embodiment, the data signal is a digital signal encoded on N bits and the number of distinct switching frequency ranges is equal to $2^N$.

According to a third embodiment, the data signal is an analogue signal.

Advantageously, the means for measuring the switching frequency comprise means for measuring the secondary voltage.

The invention also relates to a method for communicating data of a printed circuit board, the said board comprising:
- a first portion having first electronic components of which the earth electrode is on a first voltage source;
- a second portion having second electronic components of which the earth electrode is on a second voltage source;
- a switched-mode power supply circuit of which one input is connected to the first portion and of which at least one output is connected to the second portion;

the method comprising a step of modifying a switching frequency of the switched-mode power supply circuit depending on values of data to be transmitted between the first portion and the second portion, the said data being able to take at least two distinct values.

The invention also relates to a compressor housing comprising a printed circuit board according to the invention.

Other features, details and advantages of the invention will emerge more clearly on reading the description given below as an indication with respect to drawings in which:

FIG. 1 represents a compressor 2 of an air conditioning device for a motor vehicle in which the present invention can be applied.

Figure 1:
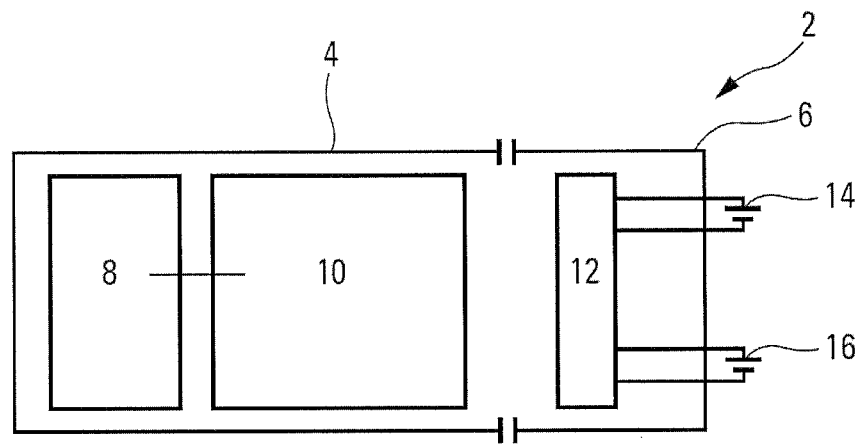
FIG. 1 is a diagram illustrating the structure of a compressor for a motor vehicle.

The compressor 2 comprises a first housing 4 and a second housing 6.

The first housing 4 comprises a compression mechanism 8 that is electrically driven.

The first housing 4 also comprises an electric motor 10 for driving the compression mechanism 8.

The second housing 6, usually made of aluminium, comprises a printed circuit board 12 called a PCB for controlling the compression mechanism 8. This PCB notably forms an inverter which powers and controls the electric motor 10.

The PCB 12 is capable of being powered at low voltage and at high voltage by a low-voltage power supply 14 and a high-voltage power supply 16 respectively.

A low voltage means a voltage lower than 60V, typically equal to 12V, and a high voltage means a voltage higher than 60V, typically equal to 300V. The low voltage corresponds to the voltage available on a protected network of the vehicle while the high voltage originates from an electrical source that also powers an electric motor responsible for driving the movement of the vehicle.

Figure 2:
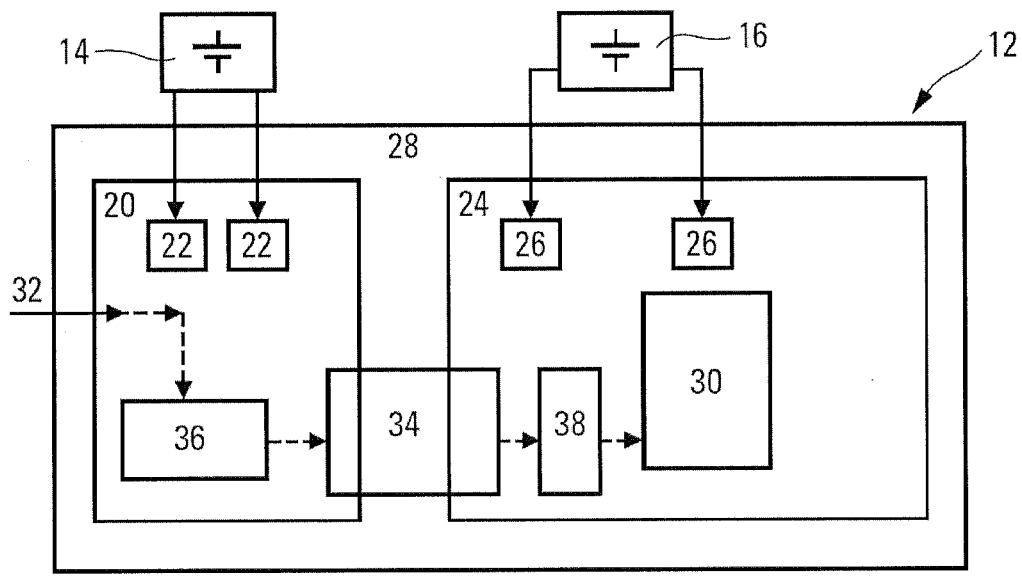
FIG. 2 is a diagram illustrating the detailed structure of an example of a printed circuit board according to one embodiment of the invention.

FIG. 2 illustrates the detailed structure of the board 12 according to a preferred embodiment of the invention.

The board 12 comprises three distinct portions.

The first portion 20 of the board 12 supports first electronic components 22 capable of being powered at low voltage by the low-voltage power supply 14.

The second portion 24 of the board 12 supports second electronic components 26 capable of being powered at high voltage by the high-voltage power supply 16.

The third portion 28 is inserted between the first portion 20 and the second portion 24. It forms a potential barrier between the two portions 20, 24. For example, this third portion 28 possesses no electrical tracks and preferably has a minimum width of 4.5 mm.

The second portion 24 also comprises a microcontroller 30 capable of receiving a data signal 32 from the first portion 20 via a switched-mode power supply circuit 34 of which one input is connected to the first portion 20 and of which one output is connected to the second portion 24.

The first portion 20 also comprises modification means 36 for varying the switching frequency of the power supply circuit 34 depending on the data signal 32.

Moreover, the second portion 24 comprises an impedance-matching circuit 38 designed to match the output of the switched-mode power supply circuit 34 to the input of the microcontroller 30.

Figure 3:
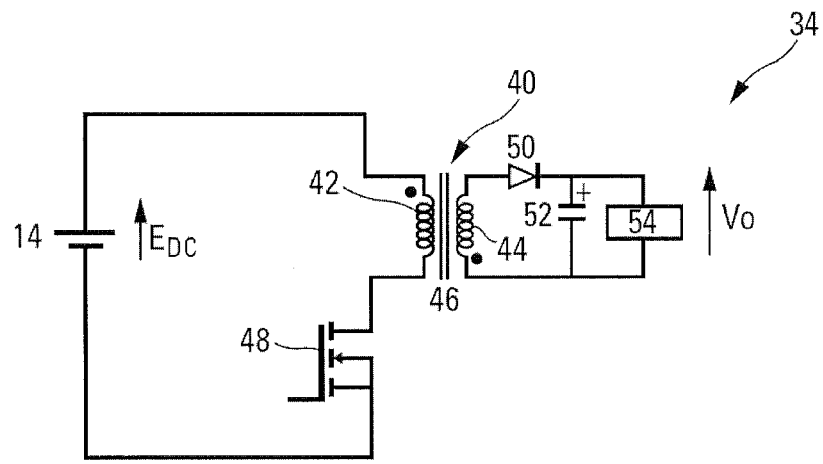
FIG. 3 is a diagram illustrating the structure of an example of a switched-mode power supply circuit of the board according to one embodiment of the invention.

FIG. 3 illustrates the structure of the switched-mode power supply circuit 34 according to a preferred embodiment of the invention.

According to this preferred embodiment, the switched-mode power supply circuit 34 is a Flyback converter comprising a transformer 40 comprising a first inductor 42 and a second inductor 44 that are coupled together.

The first inductor 42, with a value $L_1$ and having a number of turns equal to N1, forms the primary of the transformer 40. It is connected to the first portion 20 of the board 12.

The second inductor 44, with a value $L_2$ and having a number of turns equal to N2, forms the secondary of the transformer 40. It is connected to the second portion 24 of the board 12.

A galvanic isolation element 46 separates the primary 42 and the secondary 44.

The primary 42 is powered by the low-voltage power supply 14 via a switch 48 comprising an MOSFET transistor, for example.

The secondary 44 is connected to a diode 50, itself connected to a capacitor 52 connected in parallel to a load 54 comprising notably the impedance-matching circuit 38 and the microcontroller 30.

Figure 4:
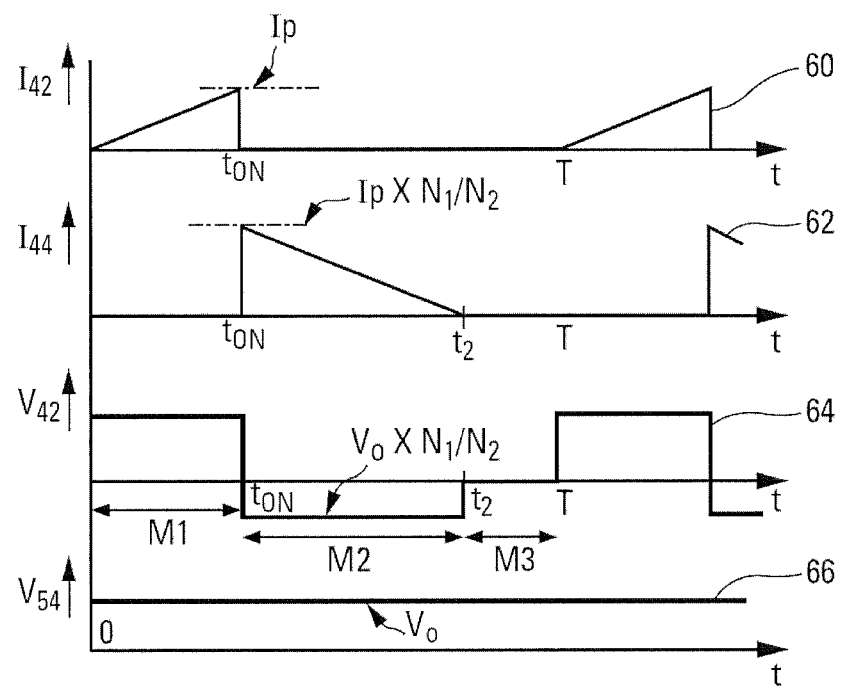
FIG. 4 is a graphic illustrating the operation of an example of a switched-mode power supply circuit.

The operation of the switched-mode power supply circuit 34 is detailed with reference to the curves 60, 62, 64, 66 of FIG. 4 which illustrate respectively the evolution of the primary current $I_{42}$, of the secondary current $I_{44}$, of the primary voltage $V_{42}$ and of the load voltage $V_{54}$ as a function of time.

The switched-mode power supply circuit 34 operates, over a switching period T, according to a predetermined duty cycle equal to $\alpha = t_{ON}/T$, $t_{ON}$ representing the period during which the switch 48 conducts.

The load voltage $V_{54}$ is constant and equal to $$V_0 = \frac{N2}{N1} \frac{\alpha}{1-\alpha} E_{DC},$$

where $E_{DC}$ is the voltage delivered by the low-voltage power supply 14, $\alpha$ is the duty cycle of the power supply circuit, N1 is the number of turns of the primary 42 and N2 is the number of turns of the secondary 44.

In the on state, for the time t between 0 and $t_{ON}$, the switch 48 is closed. The primary 42 of the transformer 40 is directly connected to the power supply 14 so that the voltage $V_{42}$ of the primary is equal to the voltage $E_{DC}$ generated by the power supply 14. The result of this is an increase in the magnetic flux in the transformer 40. The current $I_{42}$ of the primary 42 then increases according to the relation $$I_{42} = \frac{E_{DC}}{L_1} t,$$

where t represents the time, $E_{DC}$ is the voltage delivered by the low-voltage power supply 14 and $L_1$ is the value of the inductor of the primary 42.

At the end of the on state, $I_{42}$ reaches its maximum value $$I_P = \frac{E_{DC}}{L_1} t_{ON},$$

where $t_{ON}$ represents the time during which the switch 48 conducts, $E_{DC}$ is the voltage delivered by the low-voltage power supply 14 and $L_1$ is the value of the inductor of the primary 42.

Moreover, $I_P$ is a function of the power P of the components connected to the secondary 44 according to the relation $$I_P = \sqrt{\frac{2*P}{L_1*F_d}}$$

where $F_d$ is the switching frequency of the converter. It is therefore possible to determine the time $t_{ON}$ from the power P.

According to one embodiment not shown, the transformer comprises two secondaries. The power P is obtained, according to this example, by virtue of a secondary connected to the earth of the first portion coupled with a secondary connected to the earth of the second portion and powering the microprocessor.

It is noteworthy that, when the switching frequency $F_d$ is modified, the switched-mode power supply circuit continues to perform its switching function. Specifically, when the frequency $F_d$ increases, the current $I_P$ reduces and when the frequency $F_d$ reduces, the current $I_P$ increases. Thus, the energy transmitted to the secondary 44 remains constant.

Returning to FIG. 3, in the on state, the voltage at the terminals of the secondary 44 is negative, thus blocking the diode 50 so that the current of the secondary $I_{44}$ is zero. It is the capacitor 52 that supplies the energy demanded by the load 54.

At the end of the on state, at the time $t_{ON}$, the switch 48 opens thus preventing the current of the primary $I_{42}$ from continuing to flow. The conservation of the energy stored in the transformer 40 causes the appearance of a current $I_{44}$ in the secondary 44 of the transformer 40, the initial value of which is equal to $I_P \times N1/N2$. The current $I_{44}$ is given by the relation $$I_{44} = I_P \times N1/N2 - \frac{V_0}{L_2}(t - t_{ON}).$$

$I_{44}$ cancels out at $t = t_2$.

The voltage of the primary $V_{42}$, between $t_{ON}$ and $t_2$, is given by the relation $$V_{42} = -\frac{N1}{N2}V_0.$$

It is zero between $t_2$ and T.

Therefore, for a period, the switched-mode power supply circuit operates in three distinct modes: a first mode M1 for the time between 0 and $t_{ON}$, a second mode M2 for the time between $t_{ON}$ and $t_2$ and a third mode M3 for the time between $t_2$ and T.

Figure 5:
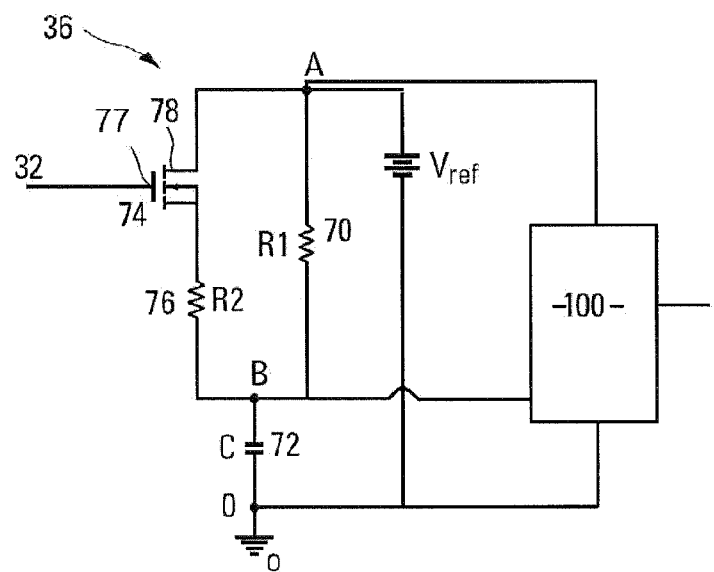
FIG. 5 is a diagram illustrating the structure of an example of means for determining the switching frequency of the board according to one embodiment of the invention.

FIG. 5 details the structure of the means 36 for modifying the switching frequency when the data signal 32 is a logic signal that can take only two values 0 and 1, for example the APC signal. The modification means modify the switching frequency of an oscillator 100 inside the switched-mode power supply circuit 34. This oscillator 100, is connected to the points A, B and O of FIG. 5.

The determination means 36 comprise a first resistor R1 70 connected in series to a capacitor C 72.

An MOS transistor 74 and a second resistor R2 76, in series with the transistor 74, are connected in parallel to the resistor 70.

The input of the data signal 32 is connected to the gate 77 of the MOS transistor 74 in order to switch this transistor 74, which has the effect of modifying the time constant of the oscillator 100. The switching frequency of the power supply circuit 34 is then also modified.

The drain 78 of the transistor 74 is connected to a voltage $V_{ref}$, for example equal to 5V.

Two time constants are possible R1*C and $$\left(\frac{R1 * R2}{R1 + R2}\right) * C$$

resulting in two distinct switching frequencies.

As an example, by choosing C=1 nF, R1=15.4 kΩ and R2=59 kΩ, the two resulting switching frequencies are F1=53 kHz and F2=66 kHz. For example, the frequency F1 corresponds to a value of the APC signal that is equal to 1 and the frequency F2 corresponds to a value of the APC signal that is equal to 0.

Depending on the tolerances of the components and of the temperature, the switching frequencies F1 and F2 may drift slightly.

By again taking the previous example, F1 is between 48 kHz and 60 kHz and F2 is between 60 kHz and 75 kHz.

The switching frequencies F1 and F2 are measured at the output of the power supply circuit 34 with the aid of a measurement of the voltage at the secondary 44 of the transformer 40.

The microcontroller 30 then determines the values of the APC signal from the switching frequencies.

The impedance-matching circuit 38 makes it possible to filter and to match the output of the power supply circuit 34 to the input of the microcontroller 30 in order to measure the switching frequency of the power supply.

Figure 6:
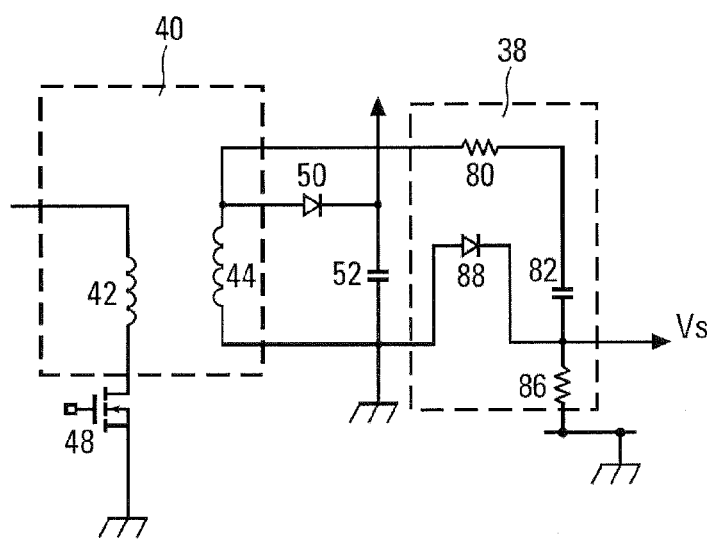
FIG. 6 is a diagram illustrating the structure of an example of an impedance-matching circuit of the board according to one embodiment of the invention.

The structure of the impedance-matching circuit 38 appears in greater detail in FIG. 6.

The matching circuit 38 comprises:
a resistor 80 connected in series to a capacitor 82; and
a resistor 86 connected in series to the assembly formed by the resistor 80 and the capacitor 82.

Based on the output voltage Vs measured at the terminals of the resistor 86, the microcontroller 30 determines the values of the data signal.

Preferably, the matching circuit 38 also comprises a diode 88 connected in parallel to the assembly of the resistor 80 and the capacitor 82 in order to limit the output voltage Vs to a value that is acceptable for the input of the microcontroller 30.

Other embodiments may also be envisaged.

Thus, when the data signal is an N-bit digital signal, the modification means comprise several circuits connected in parallel between the points A and B in FIG. 5, each of which is formed by a transistor 74 and a resistor 76 in series. The number of circuits connected in parallel is a function of the number of data signal bits to be transmitted. For example, by using N circuits in parallel, it is possible to transmit a data signal of $2^N$ bits.

When the data signal is analogue, the oscillator comprises a circuit forming a variable resistor, for example a current mirror. The analogue signal corresponds for example to an item of temperature information measured on the side of the first portion and transmitted to the microcontroller 30 in the second portion to be processed. In one particular example, the analogue signal is able to vary slowly with respect to the switching frequency, which ensures that the values of the data signal 32 correspond to different respective frequencies.

Naturally, other embodiments can be envisaged.

Therefore, the principle of the invention consisting in transmitting a data signal without passing through an isolation component by modifying the switching frequency can be used for all the applications that need to transmit data between two circuit portions connected to any two floating earths and/or between several circuit portions of which one portion is connected to a primary earth and the other portions are connected to secondary earths that float with respect to one another.

The board according to the invention has been described in an example in which the switched-mode power supply is a Flyback converter. However, the board according to the invention may comprise another type of switched-mode power supply.

The invention claimed is:

1. A printed circuit board comprising:
 a first portion having first electronic components of which the earth electrode is on a first voltage source;
 a second portion having second electronic components of which the earth electrode is on a second voltage source;
 a switched-mode power supply circuit of which one input is connected to the first portion and of which at least one output is connected to the second portion; and
 modification means for modifying a switching frequency of the switched-mode power supply circuit, without modifying an energy transmitted from the at least one output of the switched-mode power supply to the second portion, depending on data values to be transmitted between the first portion and the second portion, the said data being able to take at least two distinct values.

2. The board according to claim 1, in which the measurement means comprise a matching circuit connected to the output.

3. The board according to claim 1, further comprising means for determining the value of the data depending on the measured switching frequency.

4. The board according to claim 3, in which the means for determining the value of the data comprise a microcontroller.

5. The board according to claim 1, in which the switched-mode power supply circuit comprises a transformer of which the primary is connected to the input and the secondary is connected to the output.

6. The board according to claim 1, in which the modification means comprise a first resistor and a capacitor.

7. The board according to claim 6, in which each distinct value of the data corresponds to a distinct range of switching frequencies.

8. The board according to claim 7, in which the data signal is a logic signal and a number of distinct switching frequency ranges is equal to 2.

9. The board according to claim 8, in which the modification means comprise a MOS transistor and a second resistor, both being connected in series parallel to the first resistor, and the gate of the MOS transistor being connected to the data signal.

10. The board according to claim 7, in which the data signal is a digital signal encoded on N bits and a number of distinct switching frequency ranges is equal to $2^N$.

11. The board according to claim 7, in which the data signal is an analogue signal.

12. A compressor housing comprising a printed circuit board according to claim 1.

13. The board according to claim 1, further comprising means for measuring the switching frequency at the output of the power supply circuit.

14. A method for communicating data of a printed circuit board, the board comprising:
 a first portion having first electronic components of which the earth electrode is on a first voltage source;
 a second portion having second electronic components of which the earth electrode is on a second voltage source;
 a switched-mode power supply circuit of which one input is connected to the first portion and of which at least one output is connected to the second portion;
 wherein the method comprises:
 modifying a switching frequency of the switched-mode power supply circuit, without modifying an energy transmitted from the at least one output of the switched-mode power supply to the second portion, depending on values of data to be transmitted between the first portion and the second portion, the said data being able to take at least two distinct values.

15. A printed circuit board comprising:
 a first portion having first electronic components of which the earth electrode is on a first voltage source;
 a second portion having second electronic components of which the earth electrode is on a second voltage source;
 a switched-mode power supply circuit of which one input is connected to the first portion and of which at least one output is connected to the second portion; and
 modification means for modifying a switching frequency of an oscillator inside the switched-mode power supply circuit depending on data values to be transmitted between the first portion and the second portion, the said data being able to take at least two distinct values,
 wherein the modification means, at an input of the first portion, comprise a first resistor and a capacitor, connected in series, and
 wherein the modification means comprise a MOS transistor and a second resistor both being connected in series parallel to the first resistor, the gate of the MOS transistor being connected to the data signal.

16. A printed circuit board comprising:
 a first portion having first electronic components of which the earth electrode is on a first voltage source;
 a second portion having second electronic components of which the earth electrode is on a second voltage source;
 a switched-mode power supply circuit of which one input is connected to the first portion and of which at least one output is connected to the second portion; and
 modification means for modifying a switching frequency of an oscillator inside the switched-mode power supply circuit depending on data values to be transmitted between the first portion and the second portion, the said data being able to take at least two distinct values and being delivered from outside the first and the second portion at an input of the first portion.

17. The board according to claim 16, in which the modification means, at the input of the first portion, comprise a first resistor and a capacitor, connected in series.

18. The board according to claim 17, in which the modification means comprise a MOS transistor and a second resistor both being connected in series parallel to the first resistor, the gate of the MOS transistor being connected to the data signal.

* * * * *